(12) United States Patent
Kitt et al.

(10) Patent No.: US 11,621,469 B2
(45) Date of Patent: Apr. 4, 2023

(54) POWER-COMBINING DEVICES WITH INCREASED OUTPUT POWER

(71) Applicant: Qorvo US, Inc., Greensboro, NC (US)

(72) Inventors: John Kitt, Ventura, CA (US); Dylan Murdock, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 55 days.

(21) Appl. No.: 17/245,114

(22) Filed: Apr. 30, 2021

(65) Prior Publication Data

US 2022/0247061 A1 Aug. 4, 2022

Related U.S. Application Data

(60) Provisional application No. 63/144,106, filed on Feb. 1, 2021.

(51) Int. Cl.
*H01P 5/12* (2006.01)
*H04B 1/04* (2006.01)
*H03F 3/195* (2006.01)

(52) U.S. Cl.
CPC ............... *H01P 5/12* (2013.01); *H03F 3/195* (2013.01); *H04B 1/0458* (2013.01); *H03F 2200/451* (2013.01)

(58) Field of Classification Search
CPC ...... H01P 5/12; H01Q 13/08; H01Q 21/0025; H03F 3/195; H03F 2200/315;
(Continued)

(56) References Cited

U.S. PATENT DOCUMENTS 3,023,382 A 2/1962 Borghetti
4,234,854 A 11/1980 Schellenberg et al.
(Continued)

FOREIGN PATENT DOCUMENTS

EP 2469996 A2 6/2012
EP 3279597 A1 2/2018
(Continued)

OTHER PUBLICATIONS

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.
(Continued)

*Primary Examiner* — Tuan Pham
(74) *Attorney, Agent, or Firm* — Withrow & Terranova, P.L.L.C.

(57) ABSTRACT

Power-combining devices, and more particularly spatial power-combining devices with increased output power are disclosed. Increased output power may be realized by increasing a number of transmission paths for amplification that are associated with each amplifier assembly of a spatial power-combining device. Each transmission path may include an input antenna structure, an amplifier, and an output antenna structure for providing amplification of signals that pass therethrough. In this manner, a total number of transmission paths for amplification may be increased without having to increase a total number of amplifier assemblies. Further improvements to electrical separation and stability between neighboring amplifier assemblies may be provided by electrically grounded conductive sheets that are arranged between neighboring amplifier assemblies.

27 Claims, 12 Drawing Sheets

(58) Field of Classification Search
CPC .......... H03F 2200/451; H04B 7/0613; H04B 2001/0408; H04B 1/0458
See application file for complete search history.

(56) References Cited

U.S. PATENT DOCUMENTS

| | | | |
|---|---|---|---|
| 4,424,496 A | 1/1984 | Nichols et al. | |
| 4,612,512 A | 9/1986 | Powell et al. | |
| 4,724,400 A | 2/1988 | Luettgenau | |
| 5,036,335 A | 7/1991 | Jairam | |
| 5,162,803 A | 11/1992 | Chen | |
| 5,214,394 A | 5/1993 | Wong | |
| 5,256,988 A | 10/1993 | Izadian | |
| 5,736,908 A | 4/1998 | Alexanian et al. | |
| 5,920,240 A | 7/1999 | Mexanian et al. | |
| 6,028,483 A | 2/2000 | Shealy et al. | |
| 6,037,840 A | 3/2000 | Myer | |
| 6,181,221 B1 | 1/2001 | Kich et al. | |
| 6,828,875 B2 | 12/2004 | Channabasappa et al. | |
| 7,110,165 B2 | 9/2006 | Martin et al. | |
| 7,215,220 B1 | 5/2007 | Jia | |
| 7,466,203 B2 | 12/2008 | Rector | |
| 8,698,577 B2 | 4/2014 | Sherrer et al. | |
| 8,801,922 B2 | 8/2014 | Wrazel et al. | |
| 8,928,429 B2 | 1/2015 | Song et al. | |
| 9,019,036 B2 | 4/2015 | Kolias et al. | |
| 9,054,427 B2 | 6/2015 | Guy et al. | |
| 9,065,163 B1 | 6/2015 | Wu et al. | |
| 9,276,304 B2 | 3/2016 | Behan et al. | |
| 9,287,605 B2 | 3/2016 | Daughenbaugh, Jr. et al. | |
| 9,293,801 B2 | 3/2016 | Courtney et al. | |
| 9,325,074 B2 | 4/2016 | Chandler | |
| 9,547,344 B2 | 1/2017 | Han | |
| 9,917,343 B2 | 3/2018 | Chieh et al. | |
| 9,954,706 B1 | 4/2018 | Harris et al. | |
| 10,003,118 B2 | 6/2018 | Kitt | |
| 10,009,067 B2 | 6/2018 | Birk et al. | |
| 10,164,667 B1 | 12/2018 | Kitt | |
| 10,263,651 B1 | 4/2019 | Kitt | |
| 10,340,574 B2 | 7/2019 | Mohan et al. | |
| 10,454,433 B2 | 10/2019 | Kitt | |
| 2002/0118520 A1* | 8/2002 | Baker .................. | H05K 1/0218 361/752 |
| 2004/0108903 A1 | 6/2004 | Channabasappa et al. | |
| 2006/0202777 A1 | 9/2006 | Deckman et al. | |
| 2007/0229186 A1 | 10/2007 | Hacker et al. | |
| 2007/0279146 A1 | 12/2007 | Rector | |
| 2010/0065256 A1 | 3/2010 | Wilcoxon et al. | |
| 2011/0300230 A1 | 12/2011 | Peterson et al. | |
| 2013/0003309 A1 | 1/2013 | Stella | |
| 2014/0145794 A1 | 5/2014 | Courtney et al. | |
| 2014/0145795 A1 | 5/2014 | Behan et al. | |
| 2014/0167880 A1 | 6/2014 | Daughenbaugh, Jr. et al. | |
| 2014/0347145 A1* | 11/2014 | Nakamura .......... | H03H 11/344 333/134 |
| 2015/0270817 A1 | 9/2015 | Campbell | |
| 2017/0149113 A1 | 5/2017 | Theveneau et al. | |
| 2017/0179598 A1 | 6/2017 | Kitt | |
| 2018/0187984 A1 | 7/2018 | Manzo | |
| 2018/0294539 A1 | 10/2018 | Kitt | |
| 2019/0007007 A1 | 1/2019 | Kitt | |
| 2019/0067778 A1 | 2/2019 | Mohan | |
| 2019/0067781 A1 | 2/2019 | Mohan et al. | |
| 2019/0067782 A1 | 2/2019 | Mohan et al. | |
| 2019/0067783 A1* | 2/2019 | Mohan .................. | H03H 11/04 |
| 2019/0067836 A1 | 2/2019 | Mohan | |
| 2019/0068123 A1 | 2/2019 | Mohan et al. | |
| 2019/0068140 A1 | 2/2019 | Mohan et al. | |
| 2019/0068141 A1 | 2/2019 | Yoon et al. | |
| 2019/0081453 A1 | 3/2019 | Meehan et al. | |
| 2019/0140356 A1 | 5/2019 | Mohan | |
| 2019/0312327 A1 | 10/2019 | Kitt | |
| 2020/0041209 A1 | 2/2020 | Valenti et al. | |
| 2020/0041210 A1 | 2/2020 | Valenti et al. | |
| 2020/0162046 A1 | 5/2020 | Bojkov et al. | |
| 2020/0185803 A1 | 6/2020 | Mohan et al. | |
| 2020/0274506 A1 | 8/2020 | Yoon et al. | |
| 2021/0297048 A1 | 9/2021 | Yoon et al. | |
| 2021/0298207 A1 | 9/2021 | Murdock | |

FOREIGN PATENT DOCUMENTS

| | | |
|---|---|---|
| EP | 3454370 A1 | 3/2019 |
| FR | 3040242 A1 | 2/2017 |
| WO | 2017214357 A2 | 12/2017 |
| WO | 2018134495 A1 | 7/2018 |

OTHER PUBLICATIONS

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress In Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Battle TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Author Unknown, "Interpack 2005: An assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied

(56) References Cited

OTHER PUBLICATIONS

Physics, vol. 86, Issue 8, Oct. 1999, American Institute of Physics, pp. 4464-4466.
Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.
Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/933,783, dated May 1, 2019, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Non-Final Office Action for U.S. Appl. No. 16/005,794, dated Oct. 7, 2019, 11 pages.
Notice of Allowance for U.S. Appl. No. 16/005,794, dated Jan. 9, 2020, 7 pages.
Corrected Notice of Allowability and Examiner-Initiated Interview Summary for U.S. Appl. No. 16/005,794, dated May 26, 2020, 6 pages.
Non-Final Office Action for U.S. Appl. No. 16/032,252, dated Dec. 27, 2019, 5 pages.
Notice of Allowance for U.S. Appl. No. 16/032,252, dated Jun. 1, 2020, 7 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Notice of Allowance for U.S. Appl. No. 16/008,586, dated Feb. 4, 2020, 8 pages.
Corrected Notice of Allowance and Examiner-Initiated Interview Summary for U.S. Appl. No. 15/846,840, dated Dec. 12, 2019, 6 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Non-Final Office Action for U.S. Appl. No. 15/981,516, dated Jul. 17, 2019, 5 pages.
Notice of Allowance for U.S. Appl. No. 15/981,516, dated Jan. 15, 2020, 7 pages.
Non-Final Office Action for U.S. Appl. No. 15/933,821, dated Jul. 11, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 16/039,435, dated Jun. 17, 2020, 8 pages.
Notice of Allowance for U.S. Appl. No. 16/214,234, dated May 15, 2020, 8 pages.
Non-Final Office Action for U.S. Appl. No. 16/288,735, dated May 26, 2020, 9 pages.
Notice of Allowance for U.S. Appl. No. 16/928,092, dated Mar. 30, 2022, 7 pages.
Notice of Allowance for U.S. Appl. No. 16/820,880, dated Mar. 2, 2022, 8 pages.
Notice of Allowance for U.S. Appl. No. 16/821,531, dated Mar. 10, 2022, 8 pages.
Non-Final Office Action for U.S. Appl. No. 16/928,092, dated Oct. 27, 2021, 5 pages.
Notice of Allowance for U.S. Appl. No. 16/288,735, dated Sep. 29, 2021, 8 pages.
Non-Final Office Action for U.S. Appl. No. 16/820,880, dated Nov. 19, 2021, 10 pages.
Non-Final Office Action for U.S. Appl. No. 16/821,531, dated Nov. 10, 2021, 15 pages.
U.S. Appl. No. 16/820,880, filed Mar. 17, 2020.
U.S. Appl. No. 16/821,531, filed Mar. 17, 2020.
Non-Final Office Action for U.S. Appl. No. 16/821,531, dated Jun. 16, 2022, 15 pages.
Advisory Action, Examiner-Initiated Interview Summary, and AFCP 2.0 Decision for U.S. Appl. No. 16/191,541, dated May 21, 2020, 5 pages.
Final Office Action for U.S. Appl. No. 16/191,541, dated Mar. 31, 2020, 8 pages.
Non-Final Office Action for U.S. Appl. No. 16/191,541, dated Dec. 9, 2019, 7 pages.
Espera Jr., A.H. et al., "3D-printing and advanced manufacturing for electronics," Progress in Additive Manufacturing, Feb. 4, 2019, Springer, 24 pages.
Leigh, S.J. et al., "A Simple, Low-Cost Conductive Composite Material for 3D Printing of Electronic Sensors," PLoS ONE, vol. 7, Issue 11, Nov. 2012, 6 pages.
Sames, W.J. et al., "The Metallurgy and Processing Science of Metal Additive Manufacturing," 2016, available at https://www.osti.gov/servlets/purl/1267051, 76 pages.
Notice of Allowance for U.S. Appl. No. 16/288,735, dated Oct. 29, 2020, 7 pages.
Non-Final Office Action for U.S. Appl. No. 16/288,735, dated May 3, 2021, 8 pages.
Non-Final Office Action for U.S. Appl. No. 16/288,761, dated Apr. 1, 2021, 8 pages.
Examiner-Initiated Interview Summary for U.S. Appl. No. 16/288,761, dated Jun. 18, 2021, 2 pages.
Notice of Allowance for U.S. Appl. No. 16/288,761, dated Jun. 29, 2021, 7 pages.
Notice of Allowance for U.S. Appl. No. 16/191,541, dated Jul. 9, 2020, 7 pages.
Non-Final Office Action for U.S. Appl. No. 16/284,214, dated Aug. 20, 2020, 5 pages.
Notice of Allowance for U.S. Appl. No. 16/284,214, dated Jan. 6, 2021, 7 pages.
Notice of Allowance for U.S. Appl. No. 16/821,531, dated Sep. 20, 2022, 8 pages.
Non-Final Office Action for U.S. Appl. No. 17/663,878, dated Sep. 23, 2022, 10 pages.
Notice of Allowance and Examiner-Initiated Interview Summary for U.S. Appl. No. 17/663,878, dated Jan. 20, 2023, 9 pages.

\* cited by examiner

POWER-COMBINING DEVICES WITH INCREASED OUTPUT POWER

RELATED APPLICATIONS

This application claims the benefit of provisional patent application Ser. No. 63/144,106, filed Feb. 1, 2021, the disclosure of which is hereby incorporated herein by reference in its entirety.

FIELD OF THE DISCLOSURE

The disclosure relates generally to power-combining devices and, more particularly, to spatial power-combining devices with increased output power.

BACKGROUND

Solid state power amplifiers (SSPAs) are used for broadband radio frequency power amplification in commercial and defense communications, radar, electronic warfare, satellite, and various other communication systems. As modern SSPA applications continue to advance, increasingly higher and higher saturated output power is desired. While millimeter wave (mmWave) gallium nitride (GaN) monolithic microwave integrated circuits (MMICs) have made great strides for use in SSPAs, there are many applications where even higher power densities may be out of reach for a single device. Spatial power-combining devices have been developed that provide a means to combine the output of several separate MMICs to realize a SSPA with much larger output power than that of a single device. Spatial power-combining techniques are implemented by combining broadband signals from a number of amplifiers to provide output powers with high efficiencies and operating frequencies.

One example of a spatial power-combining device utilizes a plurality of solid-state amplifier assemblies that forms a coaxial waveguide to amplify an electromagnetic signal. Each amplifier assembly may include an input antenna structure, an amplifier, and an output antenna structure. When the amplifier assemblies are combined to form the coaxial waveguide, the input antenna structures may form an input antipodal antenna array, and the output antenna structures may form an output antipodal antenna array. In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

Antenna structures for spatial power-combining devices typically include an antenna signal conductor and an antenna ground conductor deposited on opposite sides of a substrate, such as a printed circuit board. The size of the antenna structures is related to an operating frequency of the spatial power-combining device. For example, the size of the input antenna structure is related to the frequency of energy that can be efficiently received, and the size of the output antenna structure is related to the frequency of energy that can be efficiently transmitted. Overall sizes of spatial power-combining devices typically scale larger or smaller depending on desired operating frequency ranges.

The art continues to seek improved spatial power-combining devices having improved performance characteristics while being capable of overcoming challenges associated with conventional devices.

SUMMARY

Aspects disclosed herein relate to power-combining devices, and more particularly to spatial power-combining devices with increased output power. The increased output power may be realized by increasing a number of transmission paths for amplification that are associated with each amplifier assembly of a spatial power-combining device. Each transmission path may include an input antenna structure, an amplifier, and an output antenna structure for providing amplification of signals that pass therethrough. In this manner, a total number of transmission paths for amplification may be increased without having to increase a total number of amplifier assemblies. Further improvements to electrical separation and stability between neighboring amplifier assemblies may be provided by electrically grounded conductive sheets that are arranged between neighboring amplifier assemblies.

In one aspect, a spatial power-combining device comprises a plurality of amplifier assemblies, and each amplifier assembly of the plurality of amplifier assemblies comprises: a body structure comprising a first face and a second face, wherein the second face is on an opposite side of the body structure than the first face; a first amplifier that is arranged on the first face; a second amplifier that is arranged on the second face; and a conductive sheet that covers the first amplifier on the first face, wherein the conductive sheet is electrically grounded to the body structure. In certain embodiments, each amplifier assembly further comprises: a first input antenna structure and a first output antenna structure that are coupled to the first amplifier; and a second input antenna structure and a second output antenna structure that are coupled to the second amplifier. In certain embodiments, the first input antenna structure, the first amplifier, and the first output antenna structure are arranged on a first substrate; and the second input antenna structure, the second amplifier, and the second output antenna structure are arranged on a second substrate. In certain embodiments, the first face forms a first recess and the first substrate resides within the first recess; and the second face forms a second recess and the second substrate resides within the second recess. In certain embodiments, the first substrate is arranged parallel with the first face and the second substrate is arranged parallel with the second face. In certain embodiments, the first substrate is arranged nonparallel with the first face and the second substrate is arranged nonparallel with the second face. In certain embodiments, the first substrate is arranged parallel with the first face and the second substrate is arranged nonparallel with the second face. In certain embodiments, each amplifier assembly of the plurality of amplifier assemblies forms a wedge shape and the plurality of amplifier assemblies is radially arranged to form a center waveguide section. In certain embodiments, the first face of each amplifier assembly of the plurality of amplifier assemblies is arranged to abut the second face of a neighboring amplifier assembly of the plurality of amplifier assemblies.

The spatial power-combining device may further comprise an electromagnetic absorber that is arranged on at least a portion of the conductive sheet in a position that is registered with the first amplifier. In certain embodiments, the first face forms a first recess and the first amplifier resides within the first recess; the second face forms a second recess and the second amplifier resides within the second recess; and a portion of the conductive sheet is arranged within the first recess and another portion of the conductive sheet is arranged within the second recess of a neighboring amplifier assembly of the plurality of amplifier assemblies. In certain embodiments, the conductive sheet forms a planar shape between neighboring amplifier assemblies of the plurality of amplifier assemblies. In certain embodiments, the conductive sheet forms a nonplanar shape between neighboring amplifier assemblies of the plurality of amplifier assemblies. In certain embodiments, the spatial power-combining device may further comprise an additional conductive sheet that covers the second amplifier on the second face, wherein the additional conductive sheet is electrically grounded to the body structure. In certain embodiments, the first amplifier comprises a first monolithic microwave integrated circuit (MMIC) amplifier and the second amplifier comprises a second MMIC amplifier.

In another aspect, a spatial power-combining device comprises a plurality of amplifier assemblies, and each amplifier assembly of the plurality of amplifier assemblies comprises: a body structure, wherein a recess is formed in a face of the body structure; an amplifier that is arranged within the recess; and a conductive sheet that is electrically grounded to the body structure, wherein the conductive sheet covers the amplifier within the recess. In certain embodiments, a portion of the conductive sheet resides outside the recess. In other embodiments, the conductive sheet is arranged entirely within the recess. In certain embodiments, each amplifier assembly further comprises: an input antenna structure and an output antenna structure that are coupled to the first amplifier; and a substrate that supports the amplifier, the input antenna structure, and the output antenna structure. In certain embodiments, the substrate and the amplifier are entirely arranged within the recess. In certain embodiments, each amplifier assembly further comprises one or more electromagnetic interference gaskets that are arranged between the substrate and the conductive sheet. In certain embodiments, the one or more electromagnetic interference gaskets are arranged to provide a uniform spacing between the substrate and the conductive sheet. In certain embodiments, the conductive sheet is electrically grounded to the body structure through the one or more electromagnetic interference gaskets. In certain embodiments, the body structure forms a wedge shape and the conductive sheet forms a planar shape. In certain embodiments, the body structure and the conductive sheet form wedge shapes. In certain embodiments, the recess is sloped such that a depth of the recess increases across the face of the body structure. In certain embodiments, a side of the conductive sheet is parallel with the recess.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
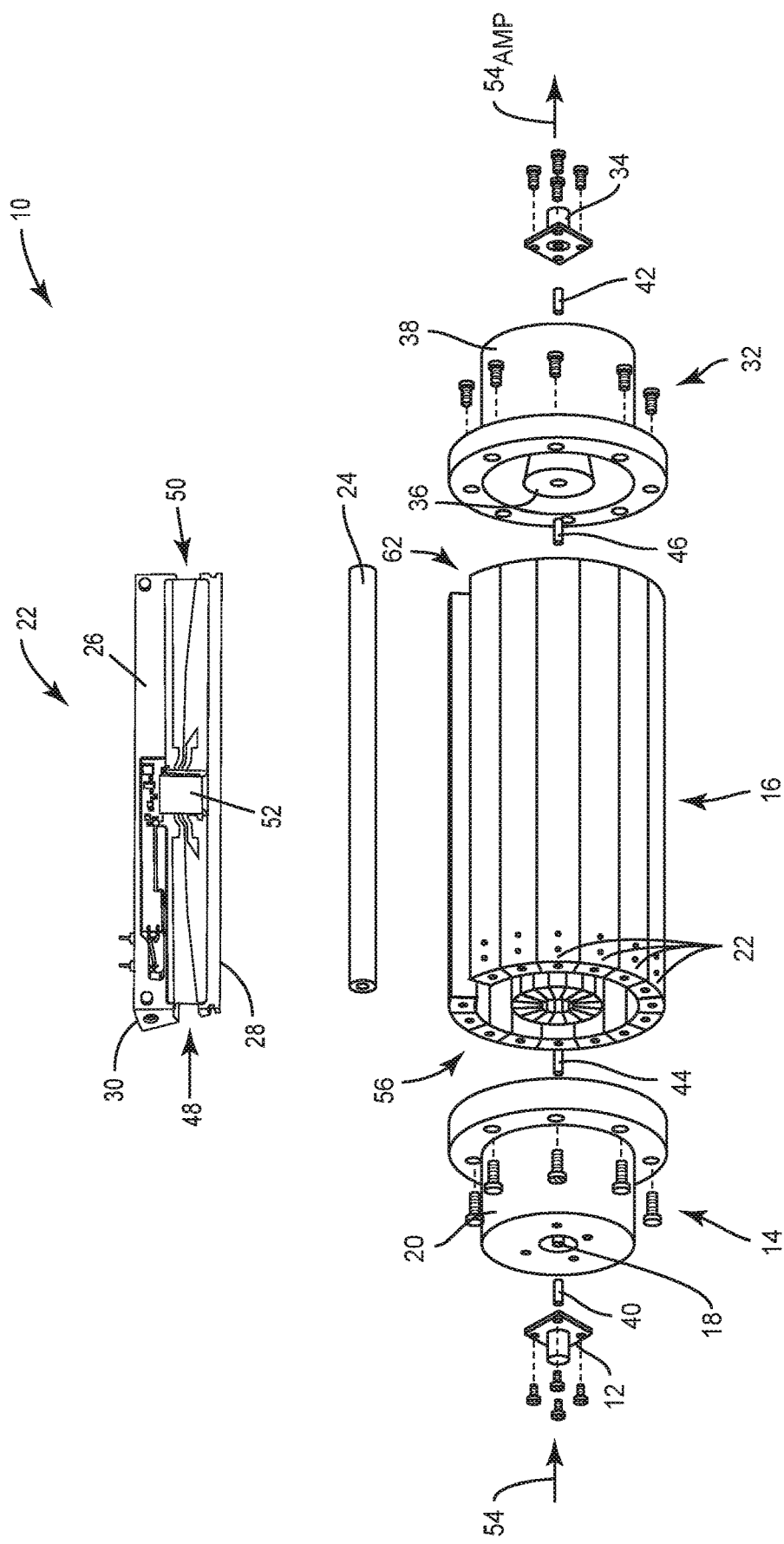
FIG. 1A is a partially-exploded perspective view of an exemplary spatial power-combining device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to power-combining devices, and more particularly to spatial power-combining devices with increased output power. The increased output power may be realized by increasing a number of transmission paths for amplification that are associated with each amplifier assembly of a spatial power-combining device. Each transmission path may include an input antenna structure, an amplifier, and an output antenna structure for providing amplification of signals that pass therethrough. In this manner, a total number of transmission paths for amplification may be increased without having to increase a total number of amplifier assemblies. Further improvements to electrical separation and stability between neighboring amplifier assemblies may be provided by electrically grounded conductive sheets that are arranged between neighboring amplifier assemblies.

The embodiments are particularly adapted to spatial power-combining devices that operate at microwave frequencies, such as, by way of a non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. In some embodiments, by way of non-limiting examples, the operating frequency range includes an operating bandwidth of 4 GHz to 40 GHz, or 2 GHz to 18 GHz, or 2 GHz to 20 GHz, or 25 to 40 GHz, among others.

A spatial power-combining device typically includes a plurality of amplifier assemblies, and each amplifier assembly typically comprises an individual signal path that includes an amplifier connected to an input antenna structure and an output antenna structure. An input coaxial waveguide is configured to provide a signal concurrently to each input antenna structure, and an output coaxial waveguide is configured to concurrently combine amplified signals from each output antenna structure. The plurality of amplifier assemblies is arranged coaxially about a center axis. Accordingly, the spatial power-combining device is configured to split, amplify, and combine an electromagnetic signal.

FIG. 1A is a partially-exploded perspective view of an exemplary spatial power-combining device 10. The spatial power-combining device 10 may comprise an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. The input coaxial waveguide section 14 may include an inner conductor 18 and an outer conductor 20 that radially surrounds the inner conductor 18, thereby forming an opening therebetween. Outer surfaces of the inner conductor 18 and an inner surface of the outer conductor 20 may have gradually changed profiles configured to minimize the impedance mismatch from the input port 12 to the center waveguide section 16.

The center waveguide section 16 comprises a plurality of amplifier assemblies 22 arranged radially around a center axis of the spatial power-combining device 10. In certain embodiments, a center post 24 is provided at the center axis for mechanical support and the plurality of amplifier assemblies 22 may be positioned circumferentially around the center post 24. In other embodiments, the center post 24 may be omitted. In FIG. 1A, the center post 24 is illustrated in an exploded manner. Each amplifier assembly 22 may include a body structure 26 having a predetermined wedge-shaped cross-section, an inner surface 28, and an arcuate outer surface 30. When the amplifier assemblies 22 are collectively assembled radially about the center axis, they form the center waveguide section 16 with a generally cylindrical shape; however, other shapes are possible, such as rectangular, oval, or other geometric shapes.

The spatial power-combining device 10 may also comprise an output coaxial waveguide section 32 and an output port 34. The input port 12 and the output port 34 may comprise any of a field-replaceable Subminiature A (SMA) connector, a super SMA connector, a type N connector, a type K connector, a WR28 connector, other coaxial to waveguide transition connectors, or any other suitable coaxial or waveguide connectors. In embodiments where the operating frequency range includes a frequency of at least 18 gigahertz (GHz), the output port 34 may comprise a waveguide output port, such as a WR28 or other sized waveguide. The output coaxial waveguide section 32 provides a broadband transition from the center waveguide section 16 to the output port 34. Electrically, the output coaxial waveguide section 32 provides broadband impedance matching from the impedance 4 of the center waveguide section 16 to an impedance 42 of the output port 34. The output coaxial waveguide section 32 includes an inner conductor 36 and an outer conductor 38 that radially surrounds the inner conductor 36, thereby forming an opening therebetween. Outer surfaces of the inner conductor 36 and an inner surface of the outer conductor 38 may have gradually changed profiles configured to minimize the impedance mismatch from the output port 34 to the center waveguide section 16. In certain embodiments, a pin 40 connects between the input port 12 and the input coaxial waveguide section 14, and a pin 42 connects between the output port 34 and the output coaxial waveguide section 32. In certain embodiments, the center post 24 connects with the inner conductors 18, 36 by way of screws 44, 46 on opposite ends of the center post 24. The center post 24 is provided for simplifying mechanical connections, may have other than a cylindrical shape, or may be omitted altogether.

Each amplifier assembly 22 comprises an input antenna structure 48 and an output antenna structure 50, both of which are coupled to an amplifier 52. In certain embodiments, the amplifier 52 comprises a monolithic microwave integrated circuit (MMIC) amplifier. In further embodiments, the MMIC may be a solid-state gallium nitride (GaN)-based MMIC. A GaN MMIC device provides high power density and bandwidth, and a spatial power-combining device may combine power from a plurality of GaN MMICs efficiently in a single step to minimize combining loss.

In operation, an input signal 54 is propagated from the input port 12 to the input coaxial waveguide section 14, where it radiates between the inner conductor 18 and the outer conductor 20 and concurrently provides the input signal 54 to the center waveguide section 16. The input antenna structures 48 of the plurality of amplifier assemblies 22 collectively form an input antenna array 56. The input antenna array 56 couples the input signal 54 from the input coaxial waveguide section 14, distributing the input signal 54 substantially evenly to each one of the amplifier assemblies 22. Each input antenna structure 48 receives a signal portion of the input signal 54 and communicates the signal portion to the amplifier 52. The amplifier 52 amplifies the signal portion of the input signal 54 to generate an amplified signal portion that is then transmitted from the amplifier 52 to the output antenna structure 50. The output antenna structures 50 collectively form an output antenna array 62 that operates to provide the amplified signal portions to be concurrently combined inside the opening of the output coaxial waveguide section 32 to form an amplified output signal $54_{AMP}$, which is then propagated through the output coaxial waveguide section 32 to the output port 34.

Figure 1B:
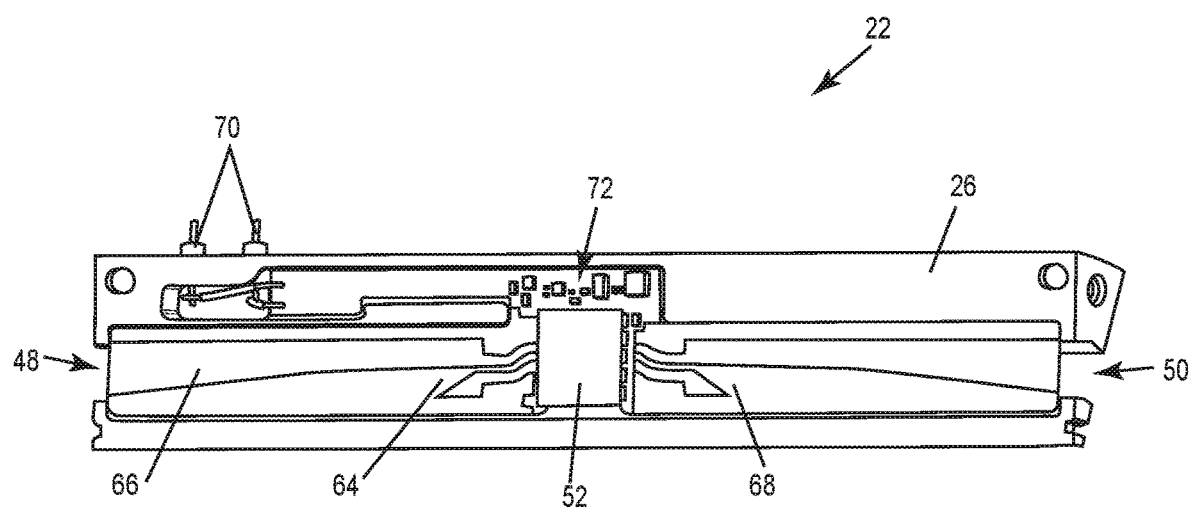
FIG. 1B is a perspective view of an individual amplifier assembly of the spatial power-combining device of FIG. 1A.

FIG. 1B is a perspective view of an individual amplifier assembly 22 of the spatial power-combining device 10 of FIG. 1A. The input antenna structure 48 may comprise an input signal conductor 64 supported on a first face of a substrate 66 or board, and the output antenna structure 50 comprises an output signal conductor 68 that is also supported on the first face of the substrate 66. The input signal conductor 64 and the output signal conductor 68 are electromagnetically coupled to the amplifier 52. The substrate 66 may comprise a printed circuit board that provides a desired form factor and mechanical support for the input signal conductor 64 and the output signal conductor 68. The input antenna structure 48 also includes an input ground conductor (not visible) on an opposing second face of the substrate 66 to the input signal conductor 64. In a similar manner, the output antenna structure 50 includes an output ground conductor (not visible) on the opposing second face of the substrate 66 to the output signal conductor 68. In other embodiments, the substrate 66 may be substituted with a plurality of substrates or boards. In still other embodiments, the input signal conductor 64, the input ground conductor (not visible), the output signal conductor 68, and the output ground conductor (not visible) are mechanically supported by the body structure 26 such that the substrate 66 may not be present. In certain embodiments, one or more ports 70 are provided for an external voltage input, such as from a direct current voltage source, and corresponding bias circuitry 72 is provided to control the amplifier 52. In certain embodiments, the bias circuitry 72 is arranged on the same substrate 66 as the antenna structures 48, 50. In other embodiments, a separate substrate may be provided for the bias circuitry 72.

In operation, a portion of the input signal (54 in FIG. 1A) is received by the input antenna structure 48 where it radiates between the input signal conductor 64 and the input ground conductor (not visible) and propagates to the amplifier 52 for amplification. For embodiments with a substrate 66, the portion of the input signal (54 in FIG. 1A) radiates between the input signal conductor 64 and the input ground conductor (not visible) through the substrate 66. For embodiments without a substrate 66, the portion of the input signal (54 in FIG. 1A) radiates between the input signal conductor 64 and the input ground conductor (not visible) through air. The amplifier 52 outputs a portion of the amplified signal ($54_{AMP}$ in FIG. 1A) to the output antenna structure 50 where it radiates between the output signal conductor 68 and the output ground conductor (not visible) in a similar manner.

Turning back to FIG. 1A, the spatial power-combining device 10 is typically utilized for high power-combining applications. Accordingly, the amplifier 52 in each of the amplifier assemblies 22 is configured for high power amplification, and may therefore generate a high amount of heat. If the operating temperature of each amplifier 52 increases too much, the performance and lifetime of each amplifier 52 may suffer. As previously described, the plurality of amplifier assemblies 22 forms the center waveguide section 16. In this regard, thermal management is needed to effectively dissipate heat in and around the center waveguide section 16. Accordingly, the body structure 26 of each amplifier assembly 22 may typically comprise a thermally conductive material, such as copper (Cu), aluminum (Al), or alloys thereof that are configured to dissipate enough heat from the amplifier 52 to maintain a suitably low operating temperature. In certain applications, the body structure 26 may comprise graphite with an electrically conductive film, such as nickel (Ni), Cu, or combinations thereof. In still further embodiments, the body structure may comprise metal-ceramic composites, including copper-diamond and/or aluminum-diamond.

Figure 2A:
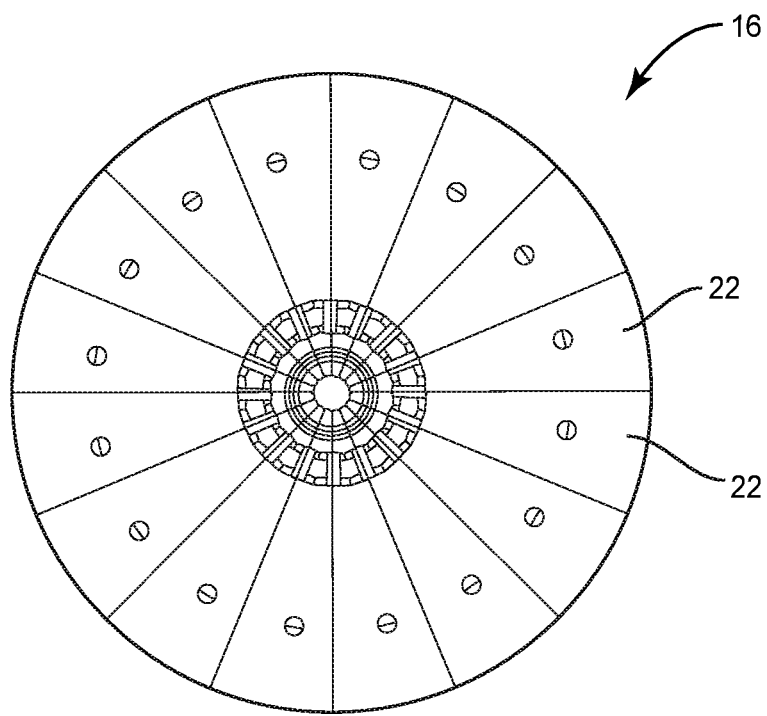
FIG. 2A is an end view of a center waveguide section for a spatial power-combining device that is similar to the spatial power-combining device of FIG. 1A.
Figure 2B:
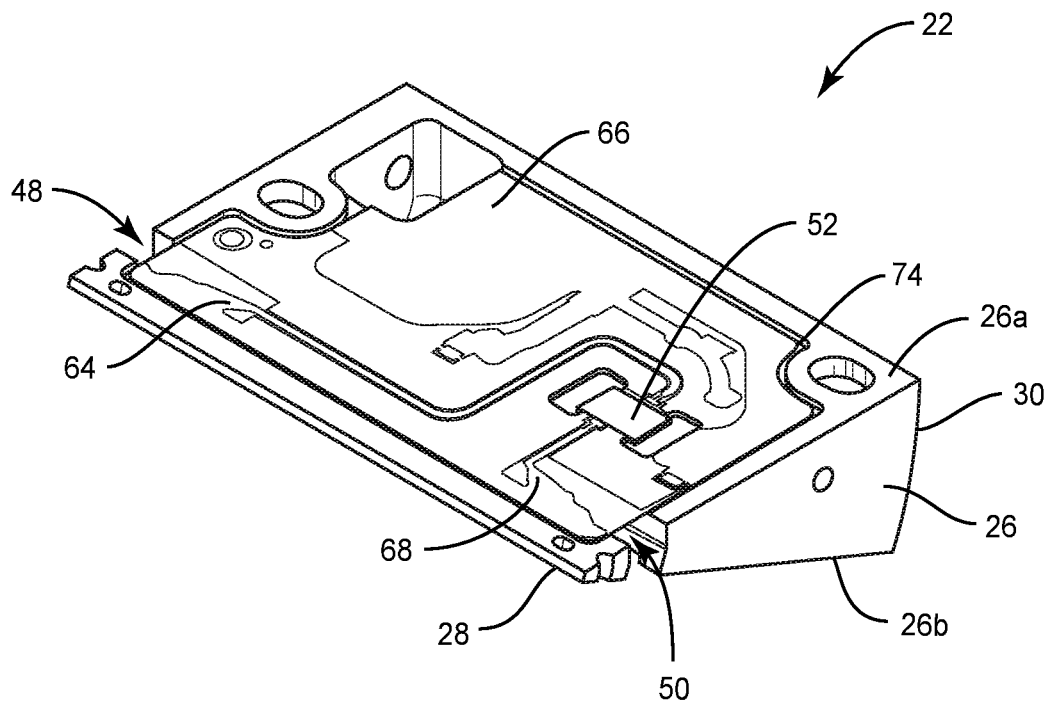
FIG. 2B is a perspective view of an individual amplifier assembly of the center waveguide section of FIG. 2A.

FIG. 2A is an end view of the center waveguide section 16 for a spatial power-combining device that is similar to the spatial power-combining device 10 of FIG. 1A. FIG. 2B is a perspective view of an individual amplifier assembly 22 of the center waveguide section 16 of FIG. 2A. As previously described, a plurality of amplifier assemblies 22 may collectively form the center waveguide section 16. As illustrated in FIG. 2B, the input antenna structure 48, the output antenna structure 50, the amplifier 52 and the corresponding substrate 66 are positioned on a first face 26a of the amplifier assembly 22 and form a transmission path for an electromagnetic signal to pass therethrough for amplification. As used herein, the input antenna structure 48, the output antenna structure 50, the amplifier 52 and the corresponding substrate 66 may be collectively referred to as an amplifier sub-assembly. In certain embodiments, the input antenna structure 48, the output antenna structure 50, the amplifier 52 and the substrate 66 may be positioned within a recess 74 that is formed on the first face 26a of the amplifier assembly 22. The recess 74 is typically formed with a depth so that the substrate 66 may sit at or just below an outermost surface of the first face 26a so the amplifier assembly 22 may snugly fit with other amplifier assemblies when assembled as illustrated in FIG. 2A. The first face 26a may extend between and be bounded by the inner surface 28 and the arcuate outer surface 30. Additionally, the first face 26a may be formed on an opposite side of the amplifier assembly 22 than a second face 26b, where the second face 26b also extends between and is bounded by the inner surface 28 and the arcuate outer surface 30. For embodiments where the amplifier assembly 22 forms a wedge-shaped cross-section, the first face 26a and the second face 26b may be positioned progressively farther apart from one another in a direction toward the arcuate outer surface 30. The antenna structures 48, 50 may be electrically grounded to the body structure 26. When assembled to form the center waveguide section 16 of FIG. 2A, the body structure 26 may accordingly provide electromagnetic isolation for the antenna structures 48, 50 from a neighboring amplifier assembly 22 that is positioned adjacent the second face 26b.

In spatial power-combining devices, power splitting on the input side of the amplifier 52 and power combining on the output side of the amplifier 52 are accomplished using the same physics where quasi-transverse electromagnetic (TEM) fields are discretized in an over-moded coaxial structure by the use of the antenna structures 48, 50. As the TEM fields pass along the length of the antenna structures 48, 50, coaxial fields are thereby split and converted to either microstrip (uStrip) or coplanar waveguide (CPW) transmissions, thereby facilitating interfacing with the amplifier 52, (e.g., a MMIC) for amplification. In practice, all of the various elements along the radio frequency (RF) chain must be sized inversely proportional to the frequency of operation. In this regard, physical limitations exist that can limit a number of amplifiers that may be provided along a single spatial power-combining device. By way of example, the center waveguide section 16 as illustrated in FIG. 2A includes sixteen amplifier assemblies 22. In order to increase a number of amplifiers assemblies 22 and corresponding amplifiers 52 present for a same targeted operating frequency, a width of the wedge shape for each body structure 26 as measured from the first face 26a to the second face 26b would need to be reduced. For example, to double the output power, the width of each body structure 26 would need to be reduced by half so that thirty-two amplifier assemblies 22 may fit together in a same radial footprint as the sixteen amplifier assemblies 22 illustrated in FIG. 2A. However, such reduced width may result in body structures 26 that are mechanically unstable, particularly for higher frequency applications associated with spatial power-combining devices. In this regard, physical limitations related to mechanical integrity of the body structure 26 can limit output powers in spatial power-combining devices, particularly for portions of the body structure 26 along or near the inner surface 28.

According to aspects of the present disclosure, output powers for spatial power-combing devices may be increased by incorporating additional amplifier sub-assemblies (e.g., input and output antenna structures, amplifiers, and corresponding substrates) with each amplifier assembly. Each additional amplifier sub-assembly corresponds with an additional and separate transmission path or chain that is associated with each amplifier assembly. Each separate transmission path associated with an individual amplifier assembly may provide separate amplification for signals that pass therethrough.

Figure 3:
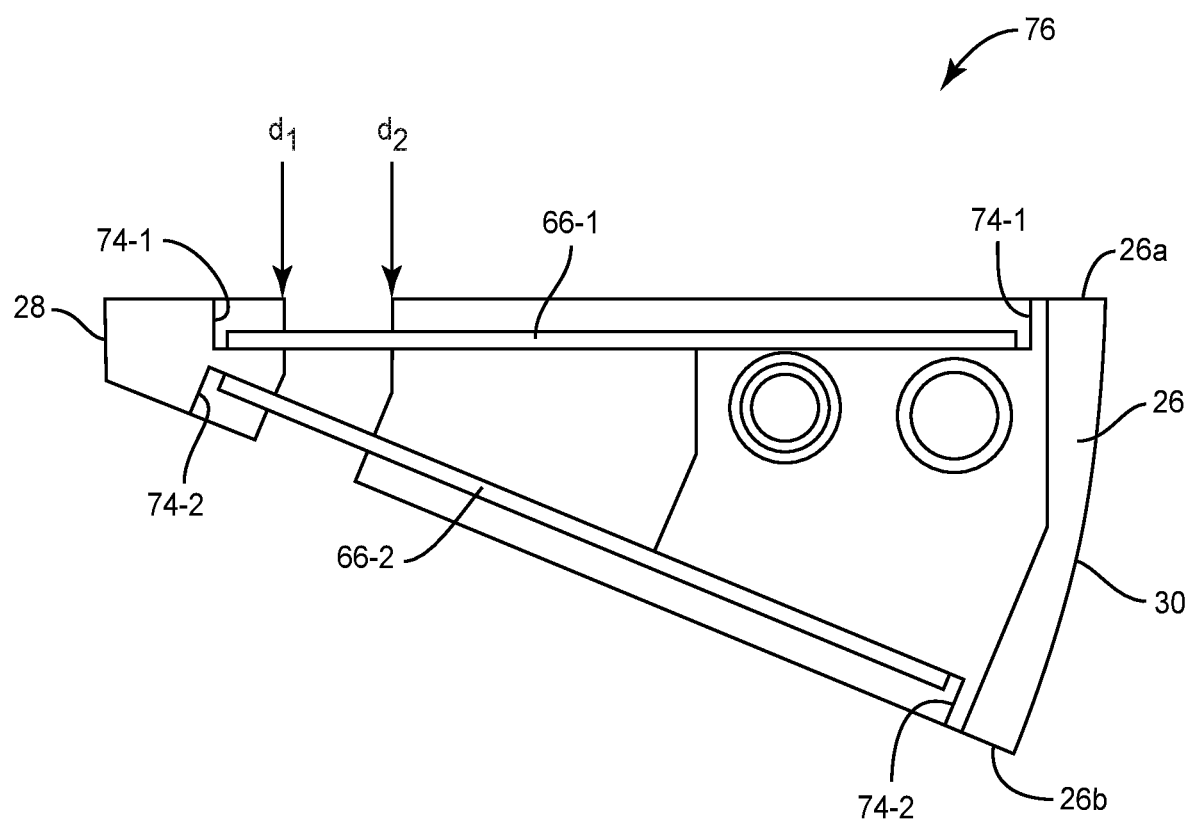
FIG. 3 is an end view of an amplifier assembly that includes multiple amplifier sub-assemblies arranged on opposing faces of a body structure to provide separate transmission paths through the amplifier assembly.

FIG. 3 is an end view of an amplifier assembly 76 that includes multiple amplifier sub-assemblies arranged on opposing faces 26a, 26b of the body structure 26 to provide separate transmission paths through the amplifier assembly 76. As illustrated, a first substrate 66-1 of a first amplifier sub-assembly is arranged on or in close proximity to the first face 26a of the body structure 26 and a second substrate 66-2 of a second amplifier sub-assembly is arranged on or in close proximity to the second face 26b. In this manner, the first amplifier sub-assembly is arranged closer to the first face 26a than the second amplifier sub-assembly, and the second amplifier sub-assembly is arranged closer to the second face 26b than the first amplifier sub-assembly. For illustrative purposes, the body structure 26 is depicted as transparent in FIG. 3 to better show locations of the first and second substrates 66-1, 66-2. In practice, the body structure 26 may include one or more metals or metal alloys as described above. Additionally, the amplifier (e.g., 52 of FIG. 2B) and antenna structures (e.g., 48, 50 of FIG. 2B) associated with each of the first and second substrates 66-1, 66-2 are not visible in FIG. 3; however, they may be present and arranged as illustrated in FIG. 1B or FIG. 2B, among other layouts. Accordingly, each amplifier assembly 76 may be configured with a separate transmission path or RF chain provided by the different amplifiers sub-assemblies that are on the opposing faces 26a, 26b of each body structure 26. In this manner, the amplifier assembly 76 may be provided with double-sided amplification. This may advantageously double the number of amplification pathways per amplifier assembly 76 without having to alter a physical footprint of the amplifier assembly 76. By way of example, the amplifier assembly 76 of FIG. 3 may be arranged according to the sixteen-amplifier assembly structure illustrated in FIG. 2A, thereby providing thirty-two separate amplification pathways without altering overall dimensions and the total number of amplifier assemblies 76 for the spatial power-combining device.

In certain embodiments, the first substrate 66-1 that corresponds with the first amplifier sub-assembly may reside in a first recess 74-1 on the first face 26a. In a like manner, the second substrate 66-2 that corresponds with the second amplifier sub-assembly may reside in a second recess 74-2 on the second face 26b. In certain embodiments, the recesses 74-1, 74-2 may be provided within the body structure 26 so that the substrates 66-1, 66-2 are positioned in a parallel manner with the respective faces 26a and 26b. The recesses 74-1, 74-2 may be formed by machining the body structure 26 from each of the first and second faces 26a, 26b. In other embodiments, the recesses 74-1, 74-2 may be formed concurrently with the remainder of the body structure 26, such as with a casting process or by additive manufacturing techniques including three—dimensional (3-D) printing. As illustrated in FIG. 3, relative depths of the recesses 74-1, 74-2 may be increased as compared with the single recess 74 of FIG. 2B. By increasing the depths of the recesses 74-1, 74-2, physical separation of the respective antenna sub-assemblies and corresponding transmission paths of the amplifier assembly 76 may be increased with those of neighboring amplifier assemblies in a spatial power-combining device. Stated differently, when two amplifier assemblies like the amplifier assembly 76 of FIG. 3 are arranged together so that the second face 26b of one amplifier assembly abuts a first face 26a of the other amplifier assembly, the deeper recesses 74-1, 74-2 provide increased spacing between the substrates 66-1, 66-2 of the neighboring amplifier assemblies 76. In certain embodiments, the depth of the recesses 74-1, 74-2 may be provided in a range that is from 1.5 to 2.5 times deeper than the recess 74 of the structure of FIG. 2B, where only a single transmission path is associated with each amplifier assembly and the body structure 26 itself of FIG. 2B may provide suitable physical and electrical separation in the structure of FIG. 2A. In certain embodiments, the depth of the recesses 74-1, 74-2 may be provided in a range from 0.005 inches to 1 inch, or in a range from 0.02 inches to 0.1 inches, depending on the desired operating frequency.

As illustrated in FIG. 3, an inner diameter $d_1$ and an outer diameter $d_2$ of the body structure 26 respectively correspond with inner and outer diameters of a coaxial waveguide channel formed in an assembled spatial power-combining device. The coaxial waveguide channel is configured to propagate electromagnetic signals to and from the amplifier sub-assemblies. In this regard, the inner diameter $d_1$ and the outer diameter $d_2$ delineate openings in the body structure 26 where the input and output antenna structures (e.g., 48, 50 of FIG. 2B) of each of the substrates 66-1, 66-2 reside. As such, input and output portions of the coaxial waveguide channel are provided on opposing sides of amplifiers that are on the substrates 66-1, 66-2. Since the recesses are formed from both the first and second faces 26a, 26b, the inner diameter $d_1$ may also be increased in order to maintain structural integrity of the body structure 26 for certain applications. In such examples, increasing the inner diameter $d_1$ without impacting frequency mode operation is possible because doubling the number of antenna sub-assemblies may halve the amount of empty space within the coaxial waveguide channel of the overall spatial power-combining device. Accordingly, there will be less space for which evanescent modes to couple and adversely impact the spatial power-combining device's intended operation. Additionally, reducing the spatial power-combining device's coaxial impedance by increasing the inner diameter $d_1$ relative to the outer diameter $d_2$ may also serve to reduce such evanescent modes.

In addition to physical separation between RF chains of neighboring amplifier assemblies, embodiments of the present disclosure may also provide improvements in electrical separation between amplifier assemblies and improved stability of amplifiers when RF chains are provided on both faces of an amplifier assembly. Such improvements may include addition of an electrically grounded conductive sheet that is secured between neighboring amplifier assemblies to provide electrical separation. In certain applications, the conductive sheet may further include an electromagnetic absorber (e.g., a microwave and/or RF absorber) that is registered between active devices, including amplifiers, of neighboring amplifier assemblies to improve stability when neighboring amplifiers are positioned in close proximity to one another.

Figure 4A:
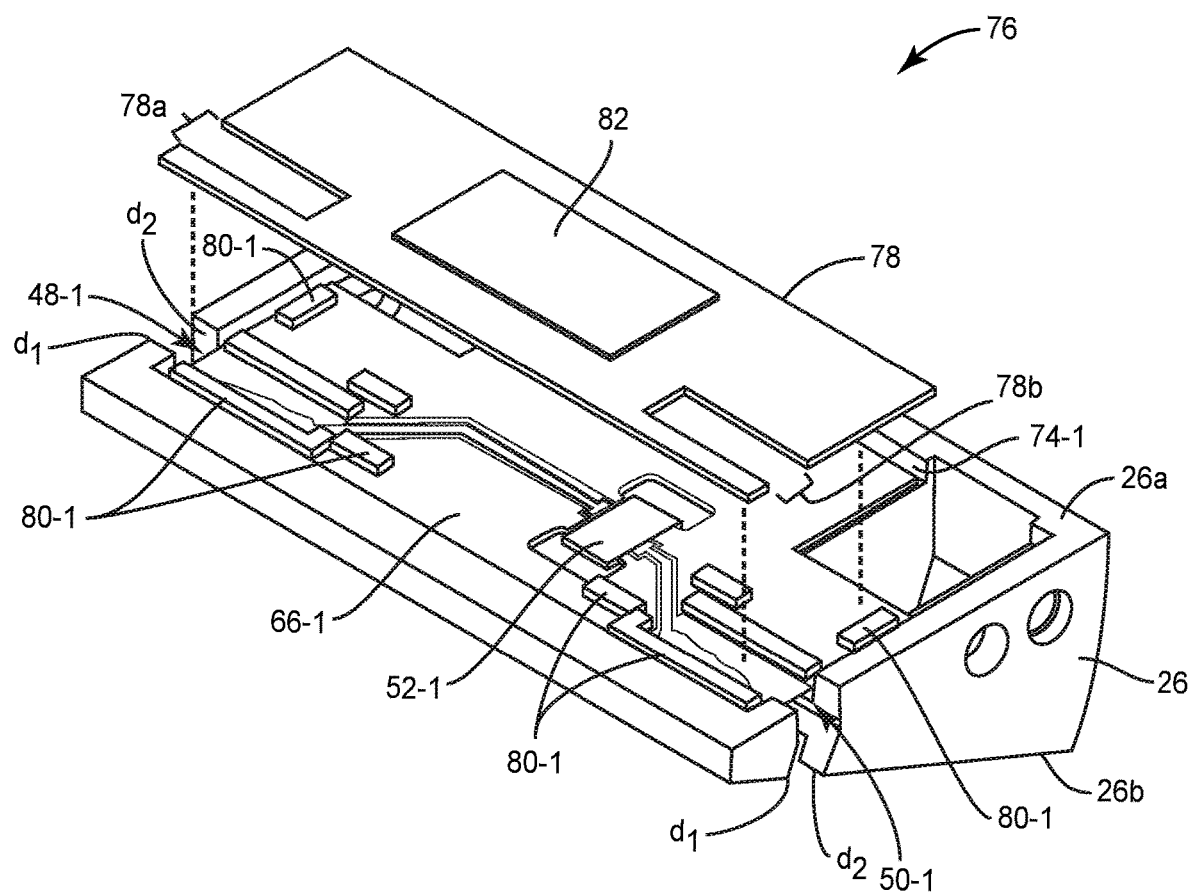
FIG. 4A is a partially exploded view of the amplifier assembly of FIG. 3 with the addition of a conductive sheet that may be electrically grounded and provided on a first face of the amplifier assembly in order to provide electrical separation improvements.
Figure 4B:
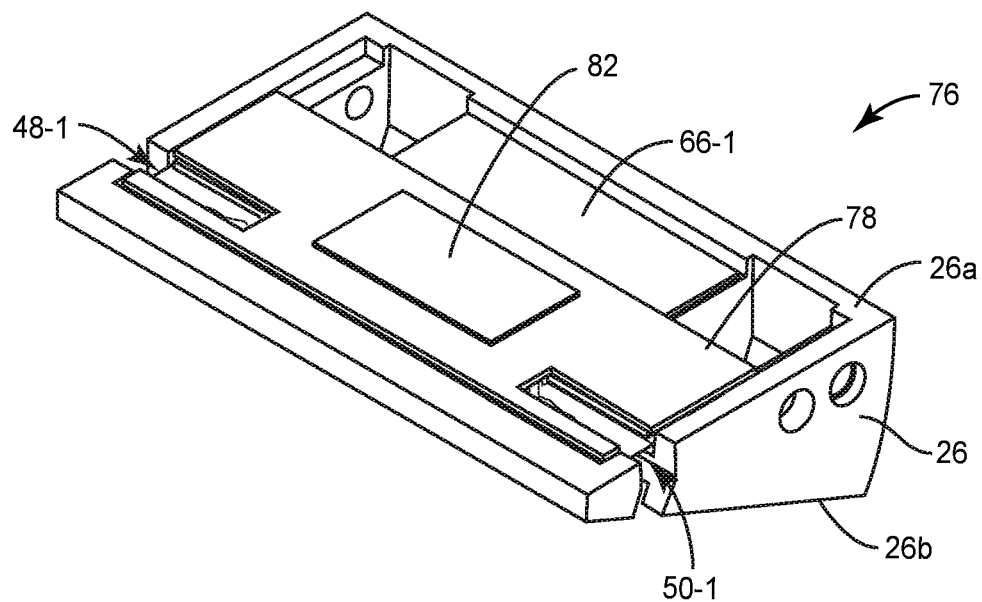
FIG. 4B is a frontside view of the amplifier assembly of FIG. 4A after attachment of the conductive sheet from the first face.
Figure 4C:
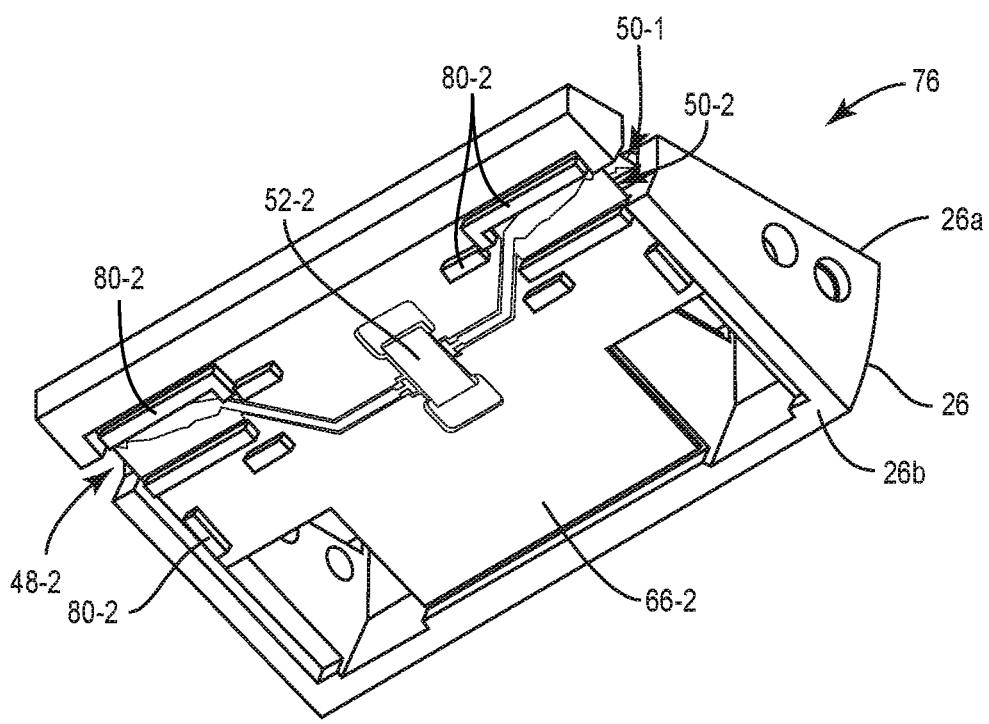
FIG. 4C is a backside view of the amplifier assembly of FIG. 4B from the second face.

FIG. 4A is a partially exploded view of the amplifier assembly 76 of FIG. 3 with the addition of a conductive sheet 78 that may be electrically grounded and provided on the first face 26a in order to provide electrical separation improvements according to principles of the present disclosure. FIG. 4B is a frontside view of the amplifier assembly 76 of FIG. 4A after attachment of the conductive sheet 78 from the first face 26a. FIG. 4C is a backside view of the amplifier assembly 76 of FIG. 4B from the second face 26b. The conductive sheet 78 may comprise an electrically conductive material that may be a same material or a different material than the body structure 26. In certain embodiments, the conductive sheet 78 may form a generally planar structure. As illustrated, the conductive sheet 78 may be sized to at least partially fit within the recess 74-1 to cover a first amplifier 52-1 within the recess 74-1 and portions of transmission lines that connect the amplifier 52-1 to a first input antenna structure 48-1 and a first output antenna structure 50-1 of the first amplifier sub-assembly that are also within the recess 74-1. In certain embodiments, the conductive sheet 78 is arranged to cover the amplifier 52-1 within the recess 74-1 and a portion of the conductive sheet 78 is arranged to reside outside the recess 74-1. A height of the amplifier 52-1 may be smaller than a corresponding depth of the recess 74-1 so that the amplifier 52-1 may reside entirely within the recess 74-1. By being electrically grounded to the body structure 26, the conductive sheet 78 may provide electrical isolation between neighboring amplifiers of neighboring amplifier assemblies. In this manner, the conductive sheet 78 may also be referred to as an electromagnetic shield structure for the amplifier assembly 76.

The conductive sheet 78 may include cut-out sections 78a, 78b that respectively correspond with the first input and output antenna structures 48-1, 50-1 of the first amplifier sub-assembly and second input and output antenna structures 48-2, 50-2 of the second amplifier sub-assembly. In this regard, the cut-out sections 78a, 78b also correspond with openings in the body structure 26 that are delineated by the inner diameter $d_1$ and the outer diameter $d_2$. The conductive sheet 78 may be mechanically secured to the substrate 66-1 and/or the body structure 26. The conductive sheet 78 may be electrically grounded to the body structure 26 by way of one or more electromagnetic interference (EMI) gaskets 80-1 as best illustrated in FIG. 4A. The EMI gaskets 80-1 may be positioned along perimeters of the input and output antenna structures 48-1, 50-1 as well as on other locations of the substrate 66-1 in order to position the conductive sheet 78 on or over the substrate 66-1 with uniform spacing therebetween. In certain embodiments, the EMI gaskets 80-1 may comprise compressible EMI gaskets 80-1.

As further illustrated in FIG. 4A and FIG. 4B, an electromagnetic absorber 82, such as a microwave and/or RF absorber, may be arranged on at least a portion of the conductive sheet 78 in a position that is registered with active elements (e.g., the amplifier 52-1) of the substrate 66-1. In certain embodiments, the electromagnetic absorber 82 may be arranged on a face of the conductive sheet 78 that is opposite the substrate 66-1 when assembled. In other embodiments, the electromagnetic absorber 82 may be provided on the opposite face of the conductive sheet 78 that is closer to the amplifier 52-1. In still further embodiments, the electromagnetic absorber 82 may be provided on both faces of the conductive sheet 78. Due to the double-sided structure where separate transmission paths are provided on opposing faces 26a, 26b of the amplifier assembly 76, the electromagnetic absorber 82 may provide suitable absorption of radiation to reduce interference between the amplifier 52-1 of the amplifier assembly 76 and the amplifier of a neighboring amplifier assembly.

As illustrated in FIG. 4C, the second substrate 66-2 of the second amplifier sub-assembly may also include one or more EMI gaskets 80-2 positioned along perimeters of the input and output antenna structures 48-2, 50-2 on either side of a second amplifier 52-2. The EMI gaskets 80-2 may further be arranged on other locations of the substrate 66-2 in a similar manner as the EMI gaskets 80-1. When the amplifier assembly 76 is arranged to form a coaxial waveguide section as illustrated in FIG. 2A, the EMI gaskets 80-2 may accordingly be arranged to position the conductive sheet 78 of a neighboring amplifier assembly on or over the substrate 66-2 with uniform spacing therebetween. Additionally, the EMI gaskets 80-2 may electrically ground the conductive sheet 78 of the neighboring amplifier assembly to the body structure 26 of the amplifier assembly 76.

Figure 5A:
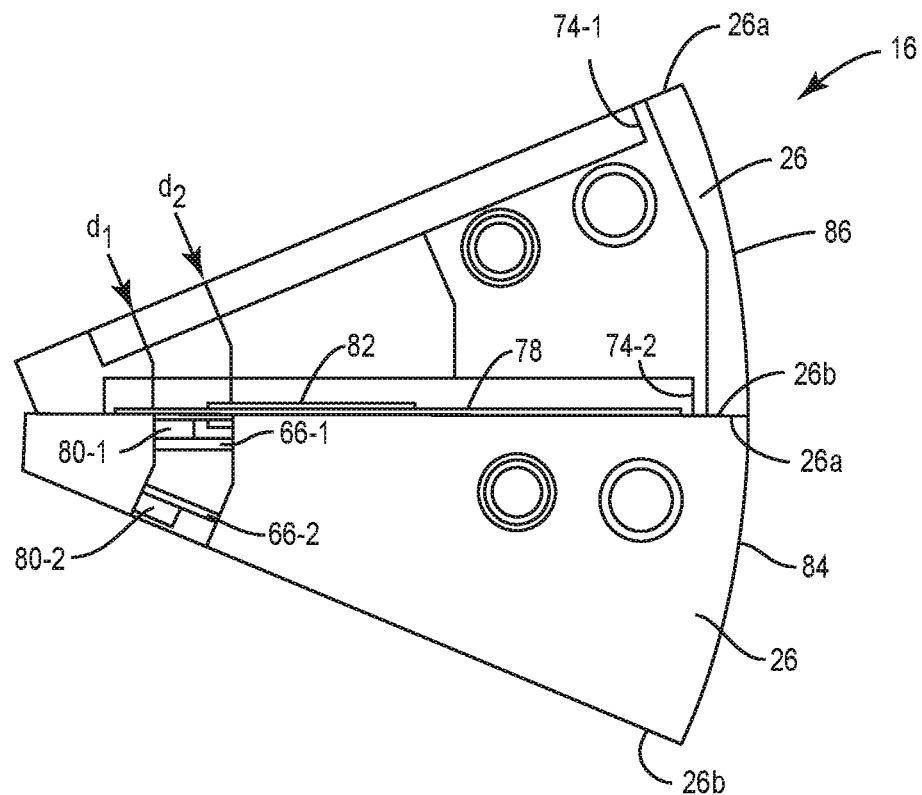
FIG. 5A is an end view of a portion of a center waveguide section that includes at least two amplifier assemblies that are both provided in a similar manner to the amplifier assembly of FIGS. 4A to 4C.
Figure 5B:
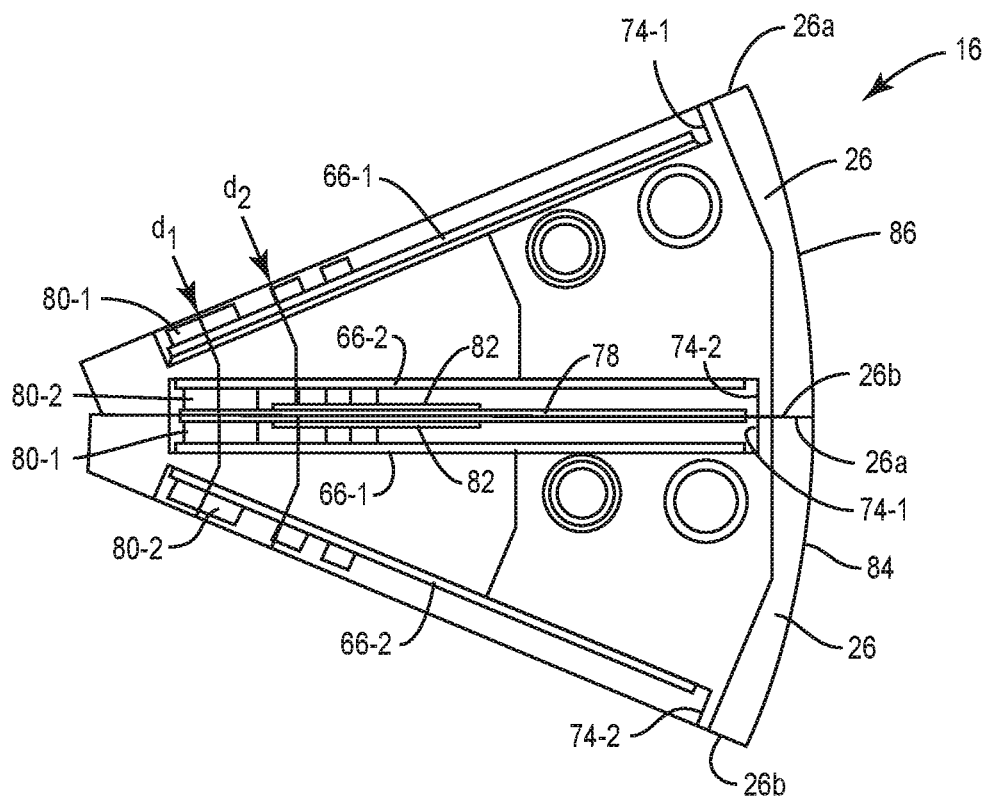
FIG. 5B is an end view of the same portion of the center waveguide section as FIG. 5A, but with the body structure of both amplifier assemblies depicted as transparent for illustrative purposes.

FIG. 5A is an end view of a portion of a center waveguide section 16 that includes at least two amplifier assemblies 84, 86 that are both provided in a similar manner to the amplifier assembly 76 of FIGS. 4A to 4C. For illustrative purposes, the body structure 26 of the amplifier assembly 86 is depicted as transparent and other elements of the amplifier assembly 86 are omitted to better illustrate the arrangement of the conductive sheet 78 between the amplifier assemblies 84, 86. FIG. 5B is an end view of the same portion of the center waveguide section 16 as FIG. 5A, but with the body structure 26 of both amplifier assemblies 84, 86 depicted as transparent for illustrative purposes. When assembled, the second face 26b of the amplifier assembly 86 may abut the first face 26a of the amplifier assembly 84 so that the amplifier assemblies 84, 86 are next adjacent neighbors of one another. As previously described for FIG. 4A, the conductive sheet 78 may be provided on the first substrate 66-1 and grounded with one or more of the EMI gaskets 80-1. As illustrated, the conductive sheet 78 may form a planar structure between the amplifier assemblies 84, 86. Notably, a portion of the conductive sheet 78 may be arranged to partially extend into the second recess 74-2 of the next adjacent amplifier assembly 86. In this manner, the conductive sheet 78 may reside in both the first recess 74-1 of the amplifier assembly 84 and the second recess 74-2 of the next adjacent amplifier assembly 86. The EMI gaskets 80-1, 80-2 may be provided with heights that uniformly space the conductive sheet 78 from both the first substrate 66-1 of the amplifier assembly 84 and the second substrate 66-2 of the amplifier assembly 86, while also electrically grounding the conductive sheet 78 to the body structure 26 of both amplifier assemblies 84, 86. In certain embodiments, the electromagnetic absorber 82 on either face of the conductive sheet 82 may entirely reside in one of the corresponding recesses 74-1, 74-2.

While only two amplifier assemblies 84, 86 are shown in FIGS. 5A and 5B, a fully assembled spatial power-combining device would have additional amplifier assemblies arrange radially about a center axis as shown in FIG. 2A. As further illustrated in FIGS. 5A and 5B, the inner diameter $d_1$ and the outer diameter $d_2$ of each amplifier assembly 84, 86 define portions of a coaxial waveguide channel for the fully assembled spatial power-combining device. In this regard, each amplifier assembly 84, 86 is configured to provide multiple transmission paths, each of which includes a separate amplifier and corresponding input and output antenna structures. Accordingly, multiple input and output antenna structures of each amplifier assembly 84, 86 are arranged within a same waveguide channel of the center waveguide section 16.

Figure 6A:
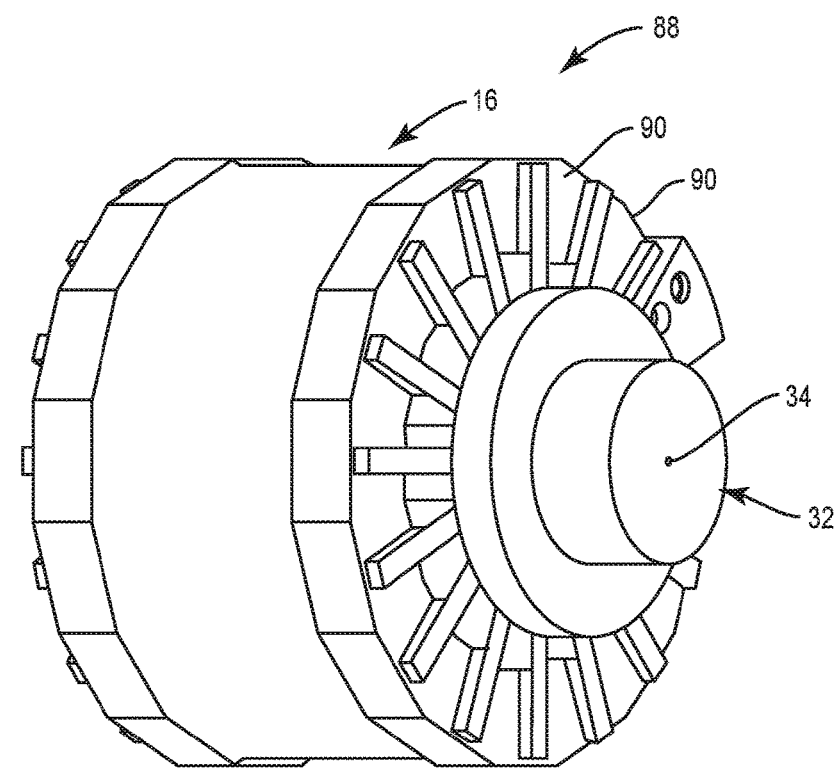
FIG. 6A is a perspective view of a model of a spatial power-combining device that includes sixteen amplifier assemblies that are configured in a similar manner as the amplifier assembly of FIGS. 4A to 4C.

In order to demonstrate the feasibility of arranging a spatial power-combining device where each amplifier assembly includes multiple transmission paths, a full three-dimensional electromagnetic simulation was performed. FIG. 6A is a perspective view of a model 88 of a spatial power-combining device that includes sixteen amplifier assemblies 90 that are modeled in a similar manner as the amplifier assembly 76 of FIGS. 4A to 4C. The model 88 includes sixteen amplifier assemblies 90 arranged radially about a center axis, where each amplifier assembly 90 includes two transmission paths for amplification. As previously described, each transmission path includes an input antenna structure, an output antenna structure, and an amplifier on a corresponding substrate. In this manner the model 88 includes thirty-two transmission paths for the sixteen amplifier assemblies 90. For the purposes of the simulation model, the amplifiers are replaced with an electrical through line in order to separate the theoretical capabilities of the model 88 from individual performances of each amplifier. As illustrated, the model 88 further includes the output coaxial waveguide section 32 and the output port 34. The model 88 further includes the input coaxial waveguide section (e.g., 14 of FIG. 1A) and the input port (e.g., 12 of FIG. 1A) that are obscured by the perspective view in FIG. 6A. By way of example, the operating frequency range for the model 88 was set in a range from 25-40 GHz.

Figure 6B:
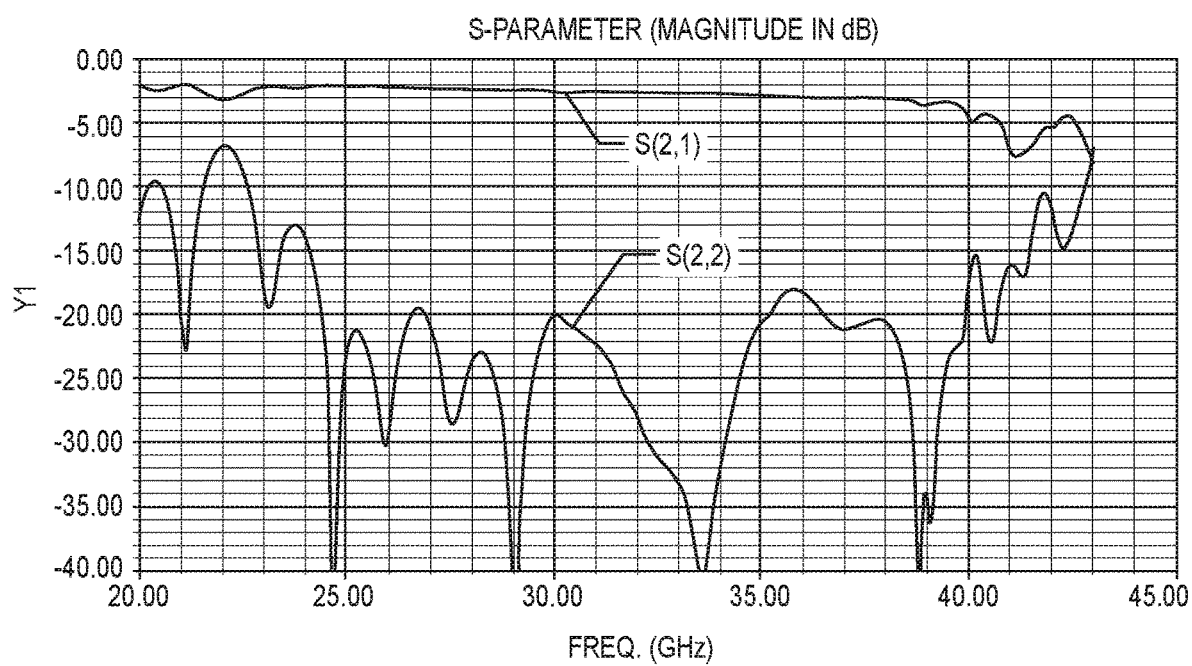
FIG. 6B is a scattering parameters (S-parameters) plot illustrating a frequency response of the spatial power-combining device from the model of FIG. 6A.

FIG. 6B is a scattering parameters (S-parameters) plot illustrating a frequency response of the spatial power-combining device from the model of FIG. 6A. The S-parameter magnitude is plotted in decibels (dB) across a GHz frequency range for the spatial power-combining device configured for 4 GHz to 40 GHz operation. The insertion loss, or S2,1, is an indication of how much power is transferred. For frequencies where S2,1 is equal to 0 dB, then substantially all power from a signal is transferred. In practice, the S2,1 value would at or near 0 dB across the intended operating frequency range. As illustrated, the S2,1 value is within about 3 dB from 0 dB for most if not all of the intended 25-40 GHz frequency range. The return loss, or S2,2, is an indication of how much power is reflected. For frequencies where S2,2 is equal to 0 dB, then substantially all power from a signal is reflected. As illustrated, the model 88 indicates a thirty-two power combiner with sixteen amplifier assemblies demonstrates a suitable percent bandwidth for operation.

Figure 7:
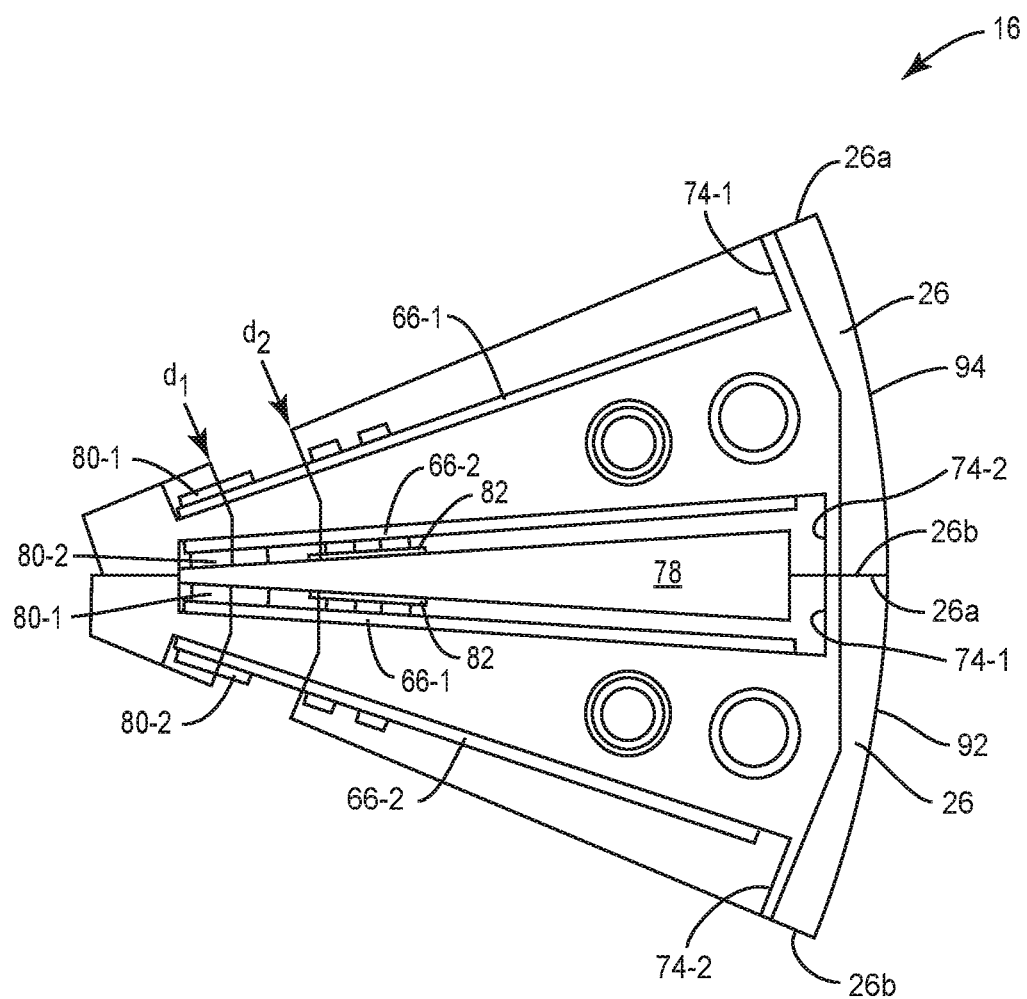
FIG. 7 is an end view of a portion of a center waveguide section that includes at least two amplifier assemblies that are similar to the amplifier assemblies of FIGS. 5A and 5B for embodiments where transmission paths are formed in a nonparallel manner with respect to first and second faces of each amplifier assembly.

FIG. 7 is an end view of a portion of a center waveguide section 16 that includes at least two amplifier assemblies 92, 94 that are provided in a similar manner to the amplifier assemblies 84, 86 of FIGS. 5A and 5B for embodiments where the transmission paths are formed in a nonparallel manner with the first and second faces 26a, 26b. For illustrative purposes, the body structure 26 of the amplifier assemblies 92, 94 are depicted as transparent to better illustrate the arrangement of the conductive sheet 78. As illustrated, the substrates 66-1, 66-2 of each amplifier assembly 92, 94 are arranged to be nonparallel with the first and second faces 26a, 26b. In order to accommodate such an arrangement, the recesses 74-1, 74-2 may be provided with sloped depths that increase with radial distance (e.g., left to right in FIG. 7) away from a center axis across the first and second faces 26a, 26b. Such an arrangement may provide further separation between amplifier sub-assemblies of neighboring amplifier assemblies 92, 94 when needed for a particular application. For example, the first substrate 66-1 of the amplifier assembly 92 and the second substrate 66-2 of the amplifier assembly 94 are spaced farther apart in FIG. 7 than the arrangement illustrated in FIG. 5B. In certain embodiments, the conductive sheet 78 may form a nonplanar shape in order to maintain uniform spacing between the respective substrates 66-1, 66-2 of the neighboring amplifier assemblies 92, 94. For example, the conductive sheet 78 may form a wedge shape with a triangular cross-section as illustrated in FIG. 7 where corresponding sides of the conductive sheet 78 are parallel with the sloped recesses 74-1, 74-2. In certain embodiments, the substrates 66-1, 66-2 may be provided nonparallel from the first and second faces 26a, 26b in a symmetric manner. For example, the arrangement of the substrate 66-1 relative to the first face 26a may be symmetric with the arrangement of the substrate 66-2 relative to second face 26b. In other embodiments, the relative spacings for the first and second substrates 66-1, 66-2 may be asymmetric with respect to the faces 26a, 26b of a particular one of the amplifier assemblies 92, 94. In such embodiments, the arrangement of first and second substrates 66-1, 66-2 across the entire center waveguide section 16 may remain symmetric.

The principles of the present disclosure are applicable to other arrangements of amplifier assemblies and corresponding spatial power-combining devices. For example, amplifier assemblies may include both a parallel transmission path and a nonparallel transmission path. In another example, amplifier assemblies may include conductive sheets arranged on both opposing faces. In still further embodiments, the principles of the present disclosure may be applicable to amplifier assemblies that include only a single transmission path.

Figure 8:
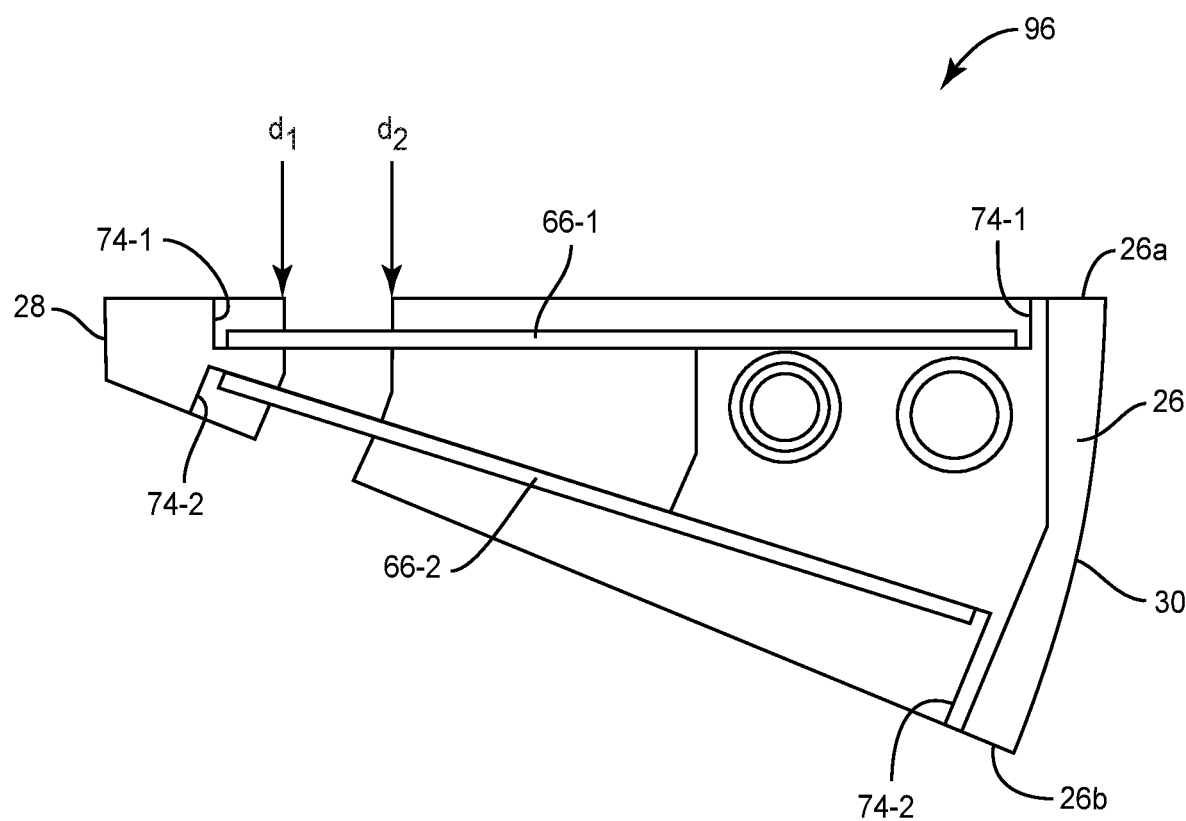
FIG. 8 is an end view of an amplifier assembly that includes parallel and nonparallel transmission paths arranged on opposing faces of the body structure.

FIG. 8 is an end view of an amplifier assembly 96 that includes parallel and nonparallel transmission paths arranged on opposing faces 26a, 26b of the body structure 26. For illustrative purposes, the body structure 26 is depicted as transparent to better show locations of the first and second substrates 66-1, 66-2 that respectfully correspond with first and second transmission paths provided by the amplifier assembly 96. As illustrated, the substrate 66-1 may be arranged in a parallel manner with the first face 26a while the substrate 66-2 may be arranged in a non-parallel manner with the second face 26b. In order to accommodate this arrangement, the recess 74-2 in the second face 26b may be angled deeper into the body structure 26 than the recess 74-1 in the first face 26a in a direction toward the outer surface 30. In certain embodiments, the relative spacing of the first and second substrates 66-1, 66-2 within the amplifier assembly 96 may provide a common spacing between all adjacent transmission paths when multiple ones of the amplifier assembly 96 are arranged to provide a corresponding spatial power-combining device. In still further embodiments, one or more conductive sheets as previously described may be provided over the substrates 66-1, 66-2.

Figure 9:
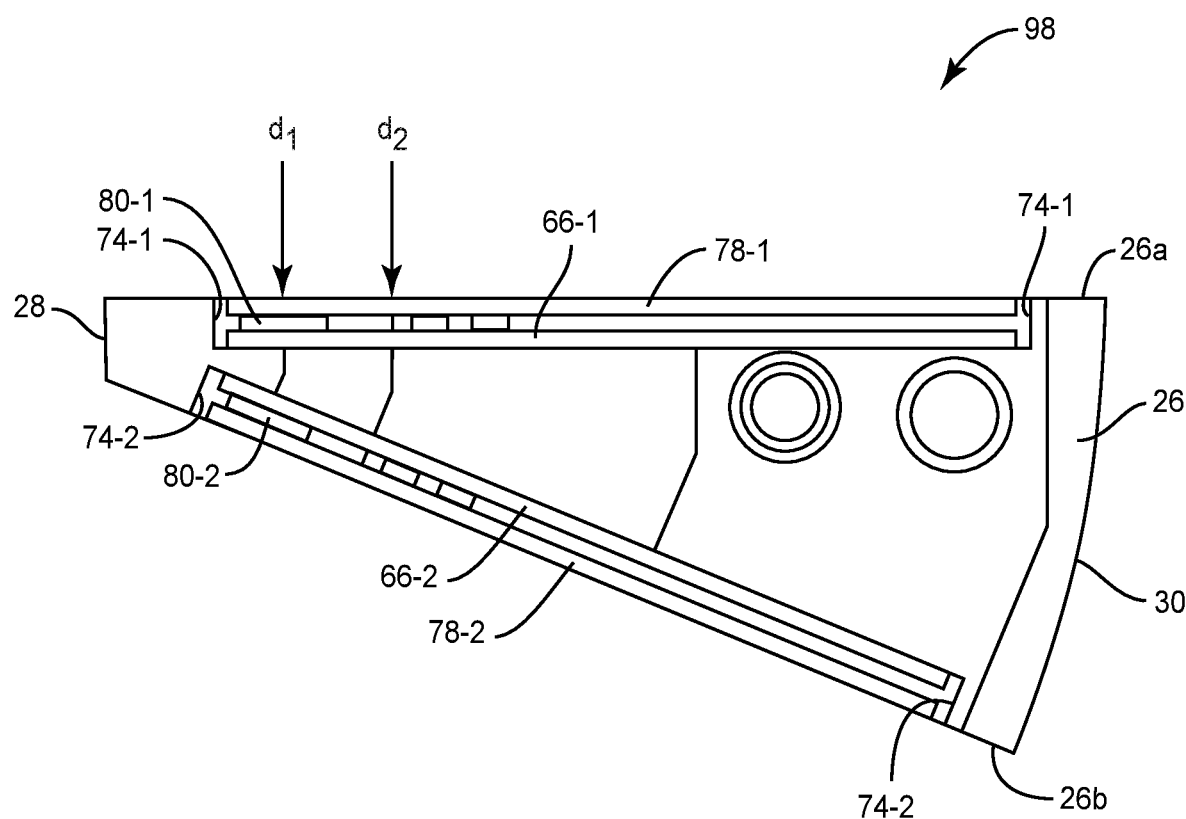
FIG. 9 is an end view of an amplifier assembly that includes multiple conductive sheets arranged on opposing faces of the body structure.

FIG. 9 is an end view of an amplifier assembly 98 that includes multiple conductive sheets 78-1, 78-2 arranged on the opposing faces 26a, 26b of the body structure 26. For illustrative purposes, the body structure 26 is depicted as transparent to better show locations of the first and second substrates 66-1, 66-2 that respectfully correspond with first and second transmission paths and to better show locations of the first and second conductive sheets 78-1, 78-2. As illustrated, the first conductive sheet 78-1 is provided at least partially within the recess 74-1 to cover the first substrate 66-1, and the second conductive sheet 78-2 is provided at least partially within the recess 74-2 to cover the second substrate 66-1. In certain embodiments, the conductive sheets 78-1, 78-2 may be arranged entirely within their corresponding recesses 74-1, 74-2 in a manner that may either be flush with the first face 26a or entirely recessed within the recesses 74-1, 74-2 so that the conductive sheets 78-1, 78-2 do not protrude outwardly from the body structure 26. In this regard, multiple ones of the amplifier assembly 98 may be arranged flush with one another to provide a corresponding spatial power-combining device. In still further embodiments, one or both of the conductive sheets 78-1, 78-2 may include the electromagnetic absorber 82 as described for FIGS. 4A and 4B.

Figure 10:
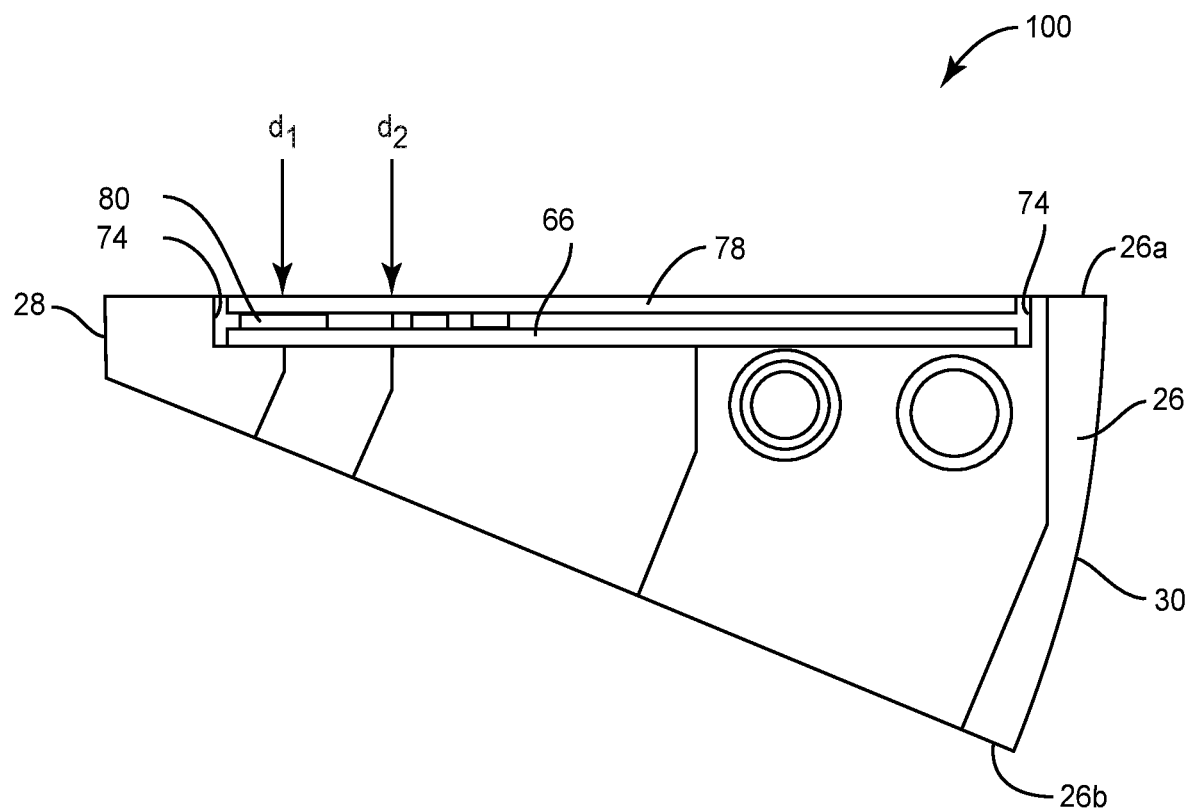
FIG. 10 is an end view of an amplifier assembly that includes a single transmission path according to principles of the present disclosure.

FIG. 10 is an end view of an amplifier assembly 100 that includes a single transmission path. For illustrative purposes, the body structure 26 is depicted as transparent to better show locations of the substrate 66 and the conductive sheet 78. As illustrated, the substrate 66 is provided within the recess 74 and the conductive sheet 78 is arranged at least partially within the recess 74. As illustrated, the conductive sheet 78 may be spaced from and electrically grounded to the substrate 66 by way of the EMI gaskets 80. In certain embodiments, the conductive sheet 78 may protrude from the first face 26a. Accordingly, the second face 26b of the amplifier assembly 100 may include a corresponding recess that is sized to receive the protruding portion of the conductive sheet of an adjacent amplifier assembly in a fully assembled spatial power-combining device. In other embodiments, the conductive sheet 78 may be arranged entirely within the recess 74 in a manner described above for FIG. 9, thereby allowing flush mounting with other amplifier assemblies in a spatial power-combining device. In still further embodiments, the conductive sheet 78 may include the electromagnetic absorber 82 as described for FIGS. 4A and 4B.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising a plurality of amplifier assemblies, each amplifier assembly of the plurality of amplifier assemblies comprising:
   a body structure comprising a first face and a second face, wherein the second face is on an opposite side of the body structure than the first face;
   a first amplifier that is arranged on the first face;
   a second amplifier that is arranged on the second face; and
   a conductive sheet that covers the first amplifier on the first face, wherein the conductive sheet is electrically grounded to the body structure.

2. The spatial power-combining device of claim 1, wherein each amplifier assembly further comprises:
   a first input antenna structure and a first output antenna structure that are coupled to the first amplifier; and
   a second input antenna structure and a second output antenna structure that are coupled to the second amplifier.

3. The spatial power-combining device of claim 2, wherein:
   the first input antenna structure, the first amplifier, and the first output antenna structure are arranged on a first substrate; and
   the second input antenna structure, the second amplifier, and the second output antenna structure are arranged on a second substrate.

4. The spatial power-combining device of claim 3, wherein:
   the first face forms a first recess and the first substrate resides within the first recess; and
   the second face forms a second recess and the second substrate resides within the second recess.

5. The spatial power-combining device of claim 3, wherein the first substrate is arranged parallel with the first face and the second substrate is arranged parallel with the second face.

6. The spatial power-combining device of claim 3, wherein the first substrate is arranged nonparallel with the first face and the second substrate is arranged nonparallel with the second face.

7. The spatial power-combining device of claim 3, wherein the first substrate is arranged parallel with the first face and the second substrate is arranged nonparallel with the second face.

8. The spatial power-combining device of claim 1, wherein each amplifier assembly of the plurality of amplifier assemblies forms a wedge shape and the plurality of amplifier assemblies is radially arranged to form a center waveguide section.

9. The spatial power-combining device of claim 1, wherein the first face of each amplifier assembly of the plurality of amplifier assemblies is arranged to abut the second face of a neighboring amplifier assembly of the plurality of amplifier assemblies.

10. The spatial power-combining device of claim 1, further comprising an electromagnetic absorber that is arranged on at least a portion of the conductive sheet in a position that is registered with the first amplifier.

11. The spatial power-combining device of claim 1, wherein:
    the first face forms a first recess and the first amplifier resides within the first recess;
    the second face forms a second recess and the second amplifier resides within the second recess; and
    a portion of the conductive sheet is arranged within the first recess and another portion of the conductive sheet is arranged within the second recess of a neighboring amplifier assembly of the plurality of amplifier assemblies.

12. The spatial power-combining device of claim 1, wherein the conductive sheet forms a planar shape between neighboring amplifier assemblies of the plurality of amplifier assemblies.

13. The spatial power-combining device of claim 1, wherein the conductive sheet forms a nonplanar shape between neighboring amplifier assemblies of the plurality of amplifier assemblies.

14. The spatial power-combining device of claim 1, further comprising an additional conductive sheet that covers the second amplifier on the second face, wherein the additional conductive sheet is electrically grounded to the body structure.

15. The spatial power-combining device of claim 1, wherein the first amplifier comprises a first monolithic microwave integrated circuit (MMIC) amplifier and the second amplifier comprises a second MMIC amplifier.

16. A spatial power-combining device comprising a plurality of amplifier assemblies, each amplifier assembly of the plurality of amplifier assemblies comprising:
    a body structure, wherein a recess is formed in a face of the body structure;
    an amplifier that is arranged within the recess; and
    a conductive sheet that is electrically grounded to the body structure, wherein the conductive sheet covers the amplifier within the recess.

17. The spatial power-combining device of claim 16, wherein a portion of the conductive sheet resides outside of the recess.

18. The spatial power-combining device of claim 16, wherein the conductive sheet is arranged entirely within the recess.

19. The spatial power-combining device of claim 16, wherein each amplifier assembly further comprises:
    an input antenna structure and an output antenna structure that are coupled to the first amplifier; and
    a substrate that supports the amplifier, the input antenna structure, and the output antenna structure.

20. The spatial power-combining device of claim 19, wherein the substrate and the amplifier are entirely arranged within the recess.

21. The spatial power-combining device of claim 19, wherein each amplifier assembly further comprises one or more electromagnetic interference gaskets that are arranged between the substrate and the conductive sheet.

22. The spatial power-combining device of claim 21, wherein the one or more electromagnetic interference gaskets are arranged to provide a uniform spacing between the substrate and the conductive sheet.

23. The spatial power-combining device of claim 21, wherein the conductive sheet is electrically grounded to the body structure through the one or more electromagnetic interference gaskets.

24. The spatial power-combining device of claim 16, wherein the body structure forms a wedge shape and the conductive sheet forms a planar shape.

25. The spatial power-combining device of claim 16, wherein the body structure and the conductive sheet form wedge shapes.

26. The spatial power-combining device of claim 25, wherein the recess is sloped such that a depth of the recess increases across the face of the body structure.

27. The spatial power-combining device of claim 26, wherein a side of the conductive sheet is parallel with the recess.

\* \* \* \* \*

UNITED STATES PATENT AND TRADEMARK OFFICE
CERTIFICATE OF CORRECTION

PATENT NO. : 11,621,469 B2
APPLICATION NO. : 17/245114
DATED : April 4, 2023
INVENTOR(S) : John Kitt and Dylan Murdock It is certified that error appears in the above-identified patent and that said Letters Patent is hereby corrected as shown below:

In the Specification

Column 7, Line 35, replace "the impedance 4" with --the impedance $Z_c$--.
Column 7, Line 36, replace "impedance 42" with --impedance $Z_{p2}$--.

Signed and Sealed this
Twenty-third Day of May, 2023

Katherine Kelly Vidal
*Director of the United States Patent and Trademark Office*